United States Patent
Hanekawa

(10) Patent No.: US 10,241,390 B2
(45) Date of Patent: Mar. 26, 2019

(54) REFLECTIVE MASK BLANK AND PROCESS FOR PRODUCING THE REFLECTIVE MASK BLANK

(71) Applicant: AGC Inc., Chiyoda-ku (JP)

(72) Inventor: Hiroshi Hanekawa, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 21 days.

(21) Appl. No.: 15/424,176

(22) Filed: Feb. 3, 2017

(65) Prior Publication Data

US 2017/0242330 A1    Aug. 24, 2017

(30) Foreign Application Priority Data

Feb. 24, 2016    (JP) ................................ 2016-033603

(51) Int. Cl.
*G03F 1/24*    (2012.01)
*H01L 21/033*    (2006.01)

(52) U.S. Cl.
CPC ............ *G03F 1/24* (2013.01); *H01L 21/0332* (2013.01); *H01L 21/0337* (2013.01)

(58) Field of Classification Search
CPC ....................................................... G03F 1/24
USPC ............................................................ 430/5
See application file for complete search history.

(56) References Cited

U.S. PATENT DOCUMENTS 9,494,483 B2 *   11/2016   Frese ................... G01M 11/005
9,851,246 B2 *   12/2017   Van Der Post ........... G01J 1/44
2016/0161837 A1   6/2016   Hamamoto et al.

OTHER PUBLICATIONS

S. Huh, et al. "Printability and Inspectability of Programmed and Real Defects on the Reticle in EUV Lithography", 2010 International Symposium on Extreme Ultraviolet Lithography, 21 pages.
Groeneveld et al, "Measuring Skewness and Kurtosis", Journal of the Royal Statistical Society, Series D (The Statistician), vol. 33, No. 4, 1984 Abstract at: https://www.jstor.org/stable/2987742?seq=1 accessed Aug. 29, 2018 (2 pages).
Measures of Skewness and Kurtosis, at https://www.itl.nist.gov/div898/handbook/eda/section3/eda35b.htm accessed Aug. 29, 2018 (6 pages).
Medcalco® Manuel, Skewness and Kurtosis, at https://www.decalc.org/manual/skewnesskurtosis.php accessed Aug. 29, 2018 (2 pages).
ISO 25178-2 Geometrical product specifications GPS) Surface texture: Areal—Part 2: Terms, definitions and surface texture parameters; First Edition 2012.
ISO 25178-6 Geometrical product specifications (GPS) Surface texture: Areal—Part 6: Classification of methods for measuring surface texture; First Edition 2010.
The manual for Scanning Probe Image Processor SPIPTM Version 6.0 excerpt version (19 pages) Copyright © 1998-2012.
The manual for Scanning Probe Image Processor SPIPTM Version 6.0 complete version filing in 2 parts 196 pp. + 266 pages, Copyright © 1998-2012.

* cited by examiner

*Primary Examiner* — Christopher G Young
(74) *Attorney, Agent, or Firm* — Oblon, McClelland, Maier & Neustadt, L.L.P.

(57) ABSTRACT

To provide a reflective mask blank having pseudo defects significantly excluded. The reflective mask blank comprises a substrate, a reflective layer for reflecting EUV light, formed on the substrate, and an absorber layer for absorbing EUV light, formed on the reflective layer, wherein $S_{sk}<1.0$ is satisfied, where $S_{sk}$ is skewness in a region of 1 μm×1 μm on the absorber layer side surface.

17 Claims, 6 Drawing Sheets

REFLECTIVE MASK BLANK AND PROCESS FOR PRODUCING THE REFLECTIVE MASK BLANK

FIELD OF INVENTION

The present invention relates to a reflective mask blank and a process for producing the reflective mask blank.

BACKGROUND OF INVENTION

In recent years, in the field of producing semiconductors, in order to make it possible to transfer patterns having a size further microsized, EUV exposure technology is expected to be promising in place of ArF exposure technology using ArF excimer laser light. In the EUV exposure technology, as the exposure light, EUV (Extreme Ultra-Violet) light having a shorter wavelength than ArF excimer laser light, is used. Here, EUV light includes soft X-ray and vacuum ultraviolet light, and it is specifically light having a wavelength of from about 0.2 nm to 100 nm. At present, as the exposure light, EUV light having a wavelength of about 13.5 nm is mainly investigated.

In the EUV exposure technology, a reflective mask is used. This mask is produced by constructing a reflective mask blank by forming various layers including a reflective layer and an absorber layer, on a substrate, and patterning the absorber layer of the reflective mask blank in a prescribed pattern.

In the EUV exposure technology, by radiating EUV light, via such a mask, to a substrate such as a wafer to be processed, it is possible to transfer the pattern of the absorber layer to the surface of the substrate to be processed (usually the surface of a resist) (hereinafter, this process will be referred to also as a "transfer process"). Then, the resist is subjected to development treatment, whereby it is possible to obtain a processed substrate having the resist with the desired pattern formed (Non-patent Document 1).

PRIOR ART DOCUMENT

Non-Patent Document

Non-patent Document 1: 2010 International Symposium on Extreme Ultraviolet Lithography, S. Huh et. al., "Printability and Inspectability of Programmed and Real Defects on the Reticle in EUV Lithography"

SUMMARY OF INVENTION

Technical Problem

In the EUV exposure technology, defects such as foreign substances, flaws, pits or scratches included in a reflective mask during the process for producing the reflective mask, are likely to have a serious influence to the transfer process. That is, in a case where a reflective mask contains such defects, the pattern of the absorber layer of the reflective mask may not correctly be transferred onto the processed substrate, and consequently, the desired microprocessing may not be effected to the processed substrate (Non-patent Document 1).

Therefore, it is important to remove such defects as far as possible in the process for producing a reflective mask or a reflective mask blank as its original form, and at the same time, it becomes important to know the number and positions of such defects beforehand.

Usually, in the case of inspecting such defects contained in a reflective mask blank, mapping inspection is carried out by a defect inspection device. The defect inspection device may, for example, be a flow inspection device "MAGICS M1350" manufactured by Lasertec Corporation, with an inspection light source wavelength being 488 nm, a flow inspection device "MAGICS M7360" manufactured by Lasertec Corporation, with an inspection light source wavelength being 266 nm, a defect inspection device "Teron 610" manufactured by KLA-Tencor Corporation, with an inspection light source wavelength being 193 nm, etc.

In the mapping inspection, a mapping chart (hereinafter referred to as a "map") of the reflective mask blank is obtainable, and in this map, plotted points are indicated at the existing positions of defects. Thus, it is considered possible to know the number and positions of defects by the number and positions of the plotted points.

However, according to a finding by the present inventors, the defects detected by the mapping inspection of a reflective mask blank may sometimes include, in addition to defects influential to the transfer process such as foreign substances, scratches, etc. (hereinafter referred to as "real defects"), defects not so much influential to the transfer process, such as very fine concavities and convexes on the surface of the absorber layer (hereinafter referred to as "pseudo defects"). If such pseudo defects are contained in the mapping results, there may be a problem that it becomes difficult to know real defects contained in the reflective mask blank.

Further, very fine concavities and convexes present on the surface of the absorber layer are likely to present an influence to the etching quality of the absorber layer. For example, if very fine concavities and convexes are present on the absorber layer surface, the roughness at the pattern edges obtained after etching (the line edge roughness) is likely to be large, and at the same time, the cross-sectional quality of the pattern is also likely to decrease. Such a quality decrease of the pattern of the absorber layer is likely to be a cause for lowering the transfer performance in the transfer process.

As an index for representing very fine concavities and convexes on the surface, Sa (root-mean-square height) is widely employed, and it is actually in practice to deal with the above problem by lowering the value of Sa as far as possible.

However, according to a result of a study made by the present inventors, it has been found that the above-mentioned decrease in the transfer performance and generation of pseudo defects are caused particularly by very fine spiky shapes among concavities and convexes of the surface. Accordingly, it is difficult to sufficiently deal with the above-mentioned problem merely by adopting Sa as an index, and it is considered that hereafter, an index for more precisely representing very fine spiky shapes, will be required.

Under these circumstances, the present invention has been made, and it is an object of the present invention to provide a process for producing a reflective mask blank, which is capable of preventing a decrease in the transfer performance to be caused by very fine surface spiky shapes of the absorber layer and which is capable of significantly suppressing pseudo defects. Further, it is another object of the present invention to provide a mask blank, whereby a decrease in the transfer performance to be caused by very fine surface spiky shapes of the absorber layer, is prevented, and pseudo defects are significantly suppressed.

Solution to Problem

The present invention provides a reflective mask blank comprising a substrate, a reflective layer for reflecting EUV light, formed on top of the substrate, and an absorber layer for absorbing EUV light, formed on top of the reflective layer, wherein $S_{sk}<1.0$ is satisfied, where $S_{sk}$ is skewness in a region of 1 µm×1 µm on the absorber layer side surface.

Here, in this application, it should be noted that the "absorber layer side surface" does not necessarily mean the surface of the absorber layer.

For example, in a case where the reflective mask blank has an absorber layer and a low reflective layer formed on the absorber layer, and the low reflective layer is the upper-most layer, the "absorber layer side surface" means the surface of the low reflective layer.

Further, the present invention provides a reflective mask blank comprising a substrate, a reflective layer for reflecting EUV light, formed on top of the substrate, and an absorber layer for absorbing EUV light, formed on top of the reflective layer, wherein $S_{ku}<10$ is satisfied, where $S_{ku}$ is kurtosis in a region of 1 µm×1 µm on the absorber layer side surface.

Further, the present invention provides a process for producing a reflective mask blank, comprising (1) a step of forming a reflective layer for reflecting EUV light, on top of a substrate, and (2) a step of forming an absorber layer for absorbing EUV light, on top of the reflective layer, wherein $S_{sk}<1.0$ is satisfied, where $S_{sk}$ is skewness in a region of 1 µm×1 µm on the surface of the absorber layer obtained in the above step (2), or $S_{ku}<10$ is satisfied, where $S_{ku}$ is kurtosis in a region of 1 µm×1 µm on the surface of the absorber layer obtained in the above step (2).

Further, the present invention provides a process for producing a reflective mask blank, comprising (1) a step of forming a reflective layer for reflecting EUV light, on top of a substrate, (2) a step of forming an absorber layer for absorbing EUV light, on top of the reflective layer, and (3) a step of forming a low reflective layer against inspection light for inspecting a pattern, having a wavelength of from 190 nm to 260 nm, on top of the absorber layer, wherein $S_{sk}<1.0$ is satisfied, where $S_{sk}$ is skewness in a region of 1 µm×1 µm on the surface of the low reflective layer obtained in the above step (3), or $S_{ku}<10$ is satisfied, where $S_{ku}$ is kurtosis in a region of 1 µm×1 µm on the surface of the low reflective layer obtained in the above step (3).

Advantageous Effects of Invention

According to the present invention, it is possible to provide a process for producing a reflective mask blank, which is capable of preventing a decrease in the transfer performance to be caused by very fine surface spiky shapes of the absorber layer and which is capable of significantly suppressing pseudo defects. Further, according to the present invention, it is possible to provide a mask blank, whereby a decrease in the transfer performance to be caused by very fine surface spiky shapes of the absorber layer, is prevented, and pseudo defects are significantly suppressed.

DETAILED DESCRIPTION OF INVENTION

Now, embodiments of the present invention will be described with reference to the drawings.

In the present application, the term "mask blank" means a substrate having an absorber layer in a state prior to being patterned in a desired pattern, as is different from a mask having a patterned absorber layer. Accordingly, in a usual case, at the stage of the "mask blank", the absorber layer is disposed in the form of a film covering the entire surface of the substrate.

(Conventional Problems)

In order to facilitate understanding of the features of the present invention, firstly, conventional problems will be briefly described with reference to FIGS. 1 to 3.

Figure 1:
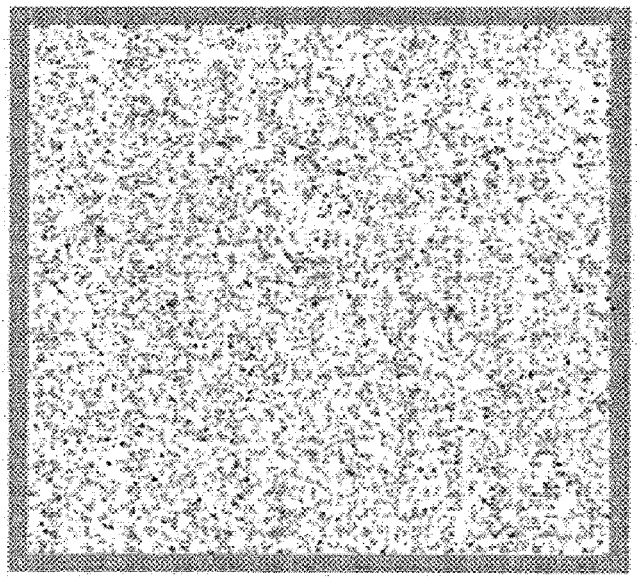
FIG. 1 is a view showing an example of a mapping result of defects at the surface of a conventional mask blank, obtained by using a defect inspection device.

FIG. 1 shows a mapping result of defects at the surface (a region of 132 mm×132 mm) of a certain mask blank (sample A), as measured by a defect inspection device (M1350). Further, FIG. 2 shows a similar mapping result obtained with respect to another mask blank (sample B).

Here, both samples A and B were prepared by sequentially forming a reflective layer (thickness: about 340 nm), an additional layer (thickness: about 2.5 nm), an absorber layer (thickness: about 75 nm) and a low reflective layer (thickness: about 5 nm) on a glass substrate.

Figure 2:
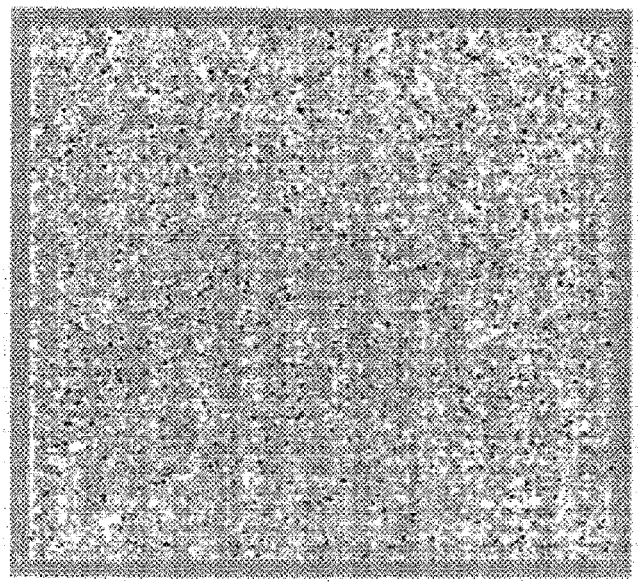
FIG. 2 is a view showing an example of a mapping result of defects at the surface of a conventional mask blank, obtained by using a defect inspection device.

From the maps in FIGS. 1 and 2, it is seen that plotted points showing defects are distributed over the entire surfaces of both samples A and B. Especially in FIG. 2, as compared with FIG. 1, it is seen that plotted points are distributed in a quite high density over the entire map.

According to these results, it is expected that real defects are present more in sample B than in sample A.

However, as a result of actually observing samples A and B by SEM, there was no substantial difference in the level of real defects contained between both samples, and the numbers of real defects were substantially equal.

This result means that the plotted points shown in the mapping results like in FIGS. 1 and 2 do not accurately reflect the real defects.

Figure 3:
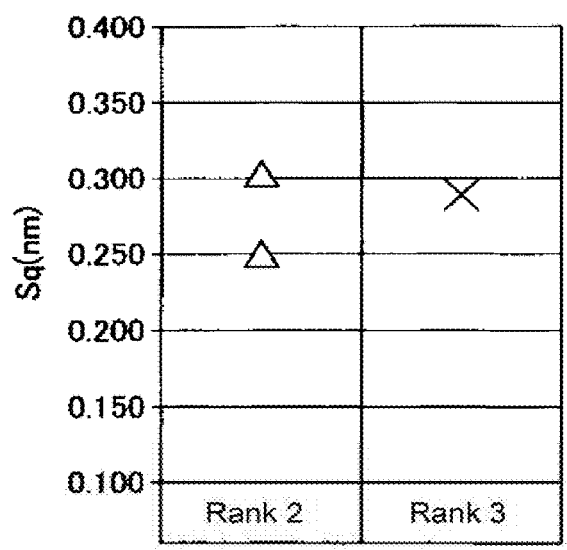
FIG. 3 is a graph showing a relation between the root-mean-square heights (Sq) obtained against the surfaces of various mask blank samples and the ranking of the defects obtainable from the mapping results.

FIG. 3 shows a relation between the root-mean-square heights (Sq) obtained against the surfaces of various mask blank samples, including the above-mentioned samples A and B, and the numbers of defects expected from the above-mentioned mapping results.

Here, the root-mean-square height Sq represents a root-mean-square height against a "surface".

Here, in order to relatively evaluate the numbers of defects, each mapping result is ranked on such a basis that a case where a mapping result having the density of plotted points as shown in FIG. 1 is obtainable, is rated to be rank 2 in the number of defects, and a case where a mapping result having the density of plotted points as shown in FIG. 2 is obtainable, is rated to be rank 3 in the number of defects. According to this ranking, the number of defects increases as the ranking number becomes large.

In FIG. 3, the abscissa represents such a rank in the number of defects expected from a mapping result. And, the ordinate represents a measured value of Sq at a surface, and this value was measured, for each sample, at a region of 1 μm×1 μm on the surface.

In general, pseudo defects are defects due to surface concavities and convexes at a substrate surface or a functional film surface, and therefore, as an evaluation index for pseudo defects contained in a mask blank, it is conceivable to use Sq.

However, from FIG. 3, it is seen that no good correlation is observed between Sq and the rank in the number of pseudo defects. Further, from this, it is expected to be difficult to properly evaluate the state of pseudo defects contained in a mask blank, by the value of Sq.

Thus, in the evaluation method of defects using maps of surface defects and/or values of Sq, it is considered to be difficult to properly evaluate pseudo defects contained in a mask blank, and further, it is considered to be difficult to properly evaluate defects by distinguishing real defects and pseudo defects.

SUMMARY OF THE PRESENT INVENTION

In the following description, the "defects" of a mask blank are defined to include "real defects" and "pseudo defects".

As mentioned above, having realized that there is a limit in accurately knowing real defects by the defect evaluation method using Sq index values, the present inventors have conducted a study for a new evaluation method capable of more accurately knowing real defects of a mask blank. And, the present inventors have found that by using skewness $S_{sk}$ and/or kurtosis $S_{ku}$ as a new index, it Is possible to significantly exclude pseudo defects, whereby it is possible to more accurately know real defects, and thus have arrived at the present invention.

That is, in one embodiment, the present invention provides a process for producing a reflective mask blank, comprising (1) a step of forming a reflective layer for reflecting EUV light, on top of a substrate, and (2) a step of forming an absorber layer for absorbing EUV light, on top of the reflective layer, wherein $S_{sk}<1.0$ is satisfied, where $S_{sk}$ is skewness in a region of 1 μm×1 μm on the surface of the absorber layer obtained in the above step (2), or $S_{ku}<10$ is satisfied, where $S_{ku}$ is kurtosis in a region of 1 μm×1 μm on the surface of the absorber layer obtained in the above step (2).

Further, in another embodiment, the present invention provides a process for producing a reflective mask blank, comprising (1) a step of forming a reflective layer for reflecting EUV light, on top of a substrate, (2) a step of forming an absorber layer for absorbing EUV light, on top of the reflective layer, and (3) a step of forming a low reflective layer against inspection light for inspecting a pattern, having a wavelength of from 190 nm to 260 nm, on top of the absorber layer, wherein $S_{sk}<1.0$ is satisfied, where $S_{sk}$ is skewness in a region of 1 μm×1 μm on the surface of the low reflective layer obtained in the above step (3), or $S_{ku}<10$ is satisfied, where $S_{ku}$ is kurtosis in a region of 1 μm×1 μm on the surface of the low reflective layer obtained in the above step (3).

In such processes for producing a mask blank, new indices being skewness $S_{sk}$ and/or kurtosis $S_{ku}$ are used for evaluation of defects.

As will be described hereinafter, these indices i.e. skewness $S_{sk}$ and/or kurtosis $S_{ku}$ can be used as indices which sufficiently correspond to the ranking results in number of defects obtainable from the above-mentioned maps.

Accordingly, when these indices are used, it is possible to significantly exclude pseudo defects contained in a mask blank. Further, it thereby becomes possible to more accurately know real defects contained in the mask blank.

As a result, in one embodiment of the present invention, it becomes possible to provide a process for producing a mask blank, whereby real defects contained, can be more accurately evaluated.

(Indices for Evaluation of Defects in One Embodiment of the Present Invention)

Now, two parameters which become important indices at the time of evaluating defects contained in a mask blank in one embodiment of the present invention, will be briefly described.

(Skewness $S_{sk}$)

Skewness $S_{sk}$ is also called degree of skew and is an index representing the symmetry of convexes and concaves at a standard height of the surface to be evaluated.

Usually, root-mean-square height $R_q$ of a surface to be evaluated, is represented by the following formula (1) where z(x) is a change in height of the surface to be evaluated, along one axis (axis X).

$$R_q = \sqrt{\frac{1}{L}\int_0^L z^2(x)dx} \qquad \text{Formula (1)}$$

Here, L represents a standard length.

When this root-mean-square height $R_q$ of one dimension (x) is represented as extended in two dimensions (x, y), the formula (2) is obtainable.

$$S_q = \sqrt{\frac{1}{A}\iint_A z^2(x, y)dxdy} \qquad \text{Formula (2)}$$

Here, A represents a standard area of the surface to be evaluated.

When this two dimensional root-mean-square height $S_q$ is used, skewness $S_{sk}$ is represented by the following formula (3).

$$S_{sk} = \frac{1}{S_q^3} \left[ \frac{1}{A} \int \int_A z^3(x, y) dx dy \right] \quad \text{Formula (3)}$$

Skewness $S_{sk}$ represents the symmetry of concaves and convexes to a standard height ($S_q$). It means that as the value of skewness $S_{sk}$ is close to 0, the number of sharp convexes and the number of sharp concaves tend to be equal. Further, it means that as the value of skewness $S_{sk}$ becomes large, the number of sharp convexes to the standard height ($S_q$) tends to be remarkable, and as the value of skewness $S_{sk}$ becomes small, the number of sharp concaves to the standard height ($S_q$) tends to be remarkable.

The value of skewness $S_{sk}$ can be used as an index which sufficiently corresponds to the ranking result in number of defects obtainable from the above-mentioned map. For example, in a case where the number of defects obtained from a mask blank is classified in rank 3, the value of skewness $S_{sk}$ becomes large, and as the number of defects becomes to be rank 2, or further to be rank 1, the value of skewness $S_{sk}$ gradually becomes small.

Accordingly, for example, in a case where the value of skewness $S_{sk}$ measured in a mask blank corresponds to a mapping state of rank 3, it can be judged that the defects obtained by the mapping inspection would contain commensurate pseudo defects. In such a case, it becomes difficult to know real defects.

On the other hand, in a case where the value of skewness $S_{sk}$ measured in a mask blank corresponds to a mapping state lower than rank 2 (e.g. "rank 1" or "rank 0" as described later), it can be judged that the defects obtained by the mapping inspection do not contain pseudo defects so much, and real defects are almost properly detected.

As will be described later, according to the results of experiments conducted by the present inventors, in a case where the value of skewness $S_{sk}$ is less than 1.0, the obtainable map becomes a mapping state of lower than rank 2 (i.e. rank 0 or rank 1). Thus, in such a case, it is possible to know the number and positions of real defects accurately to some extent from the mapping result.

Particularly, skewness $S_{sk}$ preferably satisfies $S_{sk}<0.78$, more preferably satisfies $S_{sk}<0.6$.

(Kurtosis $S_{ku}$)

Kurtosis $S_{ku}$ is also called peakedness and is an index representing the peakedness of the height distribution at the surface to be evaluated.

By using the above-mentioned two dimensional root-mean-square height $S_q$, kurtosis $S_{ku}$ is represented by the following formula (4).

$$S_{ku} = \frac{1}{S_q^4} \left[ \frac{1}{A} \int \int_A z^4(x, y) dx dy \right] \quad \text{Formula (4)}$$

Kurtosis $S_{ku}$ represents a peaked state of convexes (or concaves) to a standard height ($S_q$), and represents that as the value of kurtosis $S_{ku}$ becomes larger than 3, the number of convexes (or concaves) sharply peaked to the standard height ($S_q$) tends to remarkably increase, and as the value of kurtosis $S_{ku}$ becomes smaller than 3, the number of convexes (or concaves) sharply peaked tends to remarkably decrease. Further, kurtosis $S_{ku}=3$ means that the distribution of peakedness of convexes (or concaves) (particularly the relation between the number and the height of convexes (or concaves)) is close to a normal distribution.

The value of kurtosis $S_{ku}$ can be used as an index which sufficiently corresponds to the ranking result in number of defects obtainable from the above-mentioned map. For example, in a case where the number of defects obtained from a mask blank is classified in rank 3, the value of kurtosis $S_{ku}$ becomes large, and as the number of defects becomes to be rank 2, or further to be rank 1, the value of kurtosis $S_{ku}$ gradually becomes small.

Accordingly, for example, in a case where the value of kurtosis $S_{ku}$ measured in a mask blank corresponds to a mapping state of rank 3, it can be judged that the defects obtained by the mapping inspection would contain commensurate pseudo defects. In such a case, it becomes difficult to know real defects.

On the other hand, in a case where the value of kurtosis $S_{ku}$ measured in a mask blank corresponds to a mapping state lower than rank 2 (e.g. "rank 1" or "rank 0" as described later), it can be judged that the defects obtained by the mapping inspection do not contain pseudo defects so much, and real defects are almost properly detected.

As will be described later, according to the results of experiments conducted by the present inventors, in a case where the value of kurtosis $S_{ku}$ is less than 10, the obtainable map becomes a mapping state of lower than rank 2 (i.e. rank 0 or rank 1). Thus, in such a case, it is possible to know the number and positions of real defects accurately to some extent from the mapping result.

Particularly, kurtosis $S_{ku}$ preferably satisfies $S_{ku}<8$, more preferably satisfies $S_{ku}<6$.

Further, in the present application, skewness $S_{sk}$ and kurtosis $S_{ku}$ are values at the time when measured at a scanning frequency of 0.50 Hz.

(Power Spectrum Density PSD)

A power spectrum density PSD is obtainable by converting a two dimensional height change z (x, y) to a spatial frequency domain. The power spectrum density PSD represents an amplitude intensity as a function of spatial frequency.

$$F(u,v) = \int_{-\infty}^{\infty} \int_{-\infty}^{\infty} z(x,y) e^{-j2\pi(ux+vy)} dx dy \quad \text{Formula (5)}$$

$$P(u,v) = |F(u,v)|^2 \quad \text{Formula (6)}$$

Here, F(u, v) represents a two-dimensional Fourier transformation, and P(u, v) represents PSD.

By using PSD, it becomes possible to take a change in surface state not only as a change in height, but also as a response to spatial frequency in planar direction, and it becomes possible to quantify a very fine surface state. Therefore, PSD is used to be employed for controlling the fine surface state. For example, it is possible to suppress an amplitude of a very fine roughness component, by adjusting PSD at a spatial frequency of from 1 to 10 µm$^{-1}$ to be at most 50 nm$^4$. However, from the results of experiments conducted by the present inventors, it has been made apparent that particularly for the purpose of controlling a very fine spiky shape, rather than PSD, $S_{sk}$ or $S_{ku}$ presents an index having a higher numerical value in sensitivity, and that the numerical control by PSD is not sufficient.

(Mask Blank in One Embodiment of the Present Invention)

Figure 4:
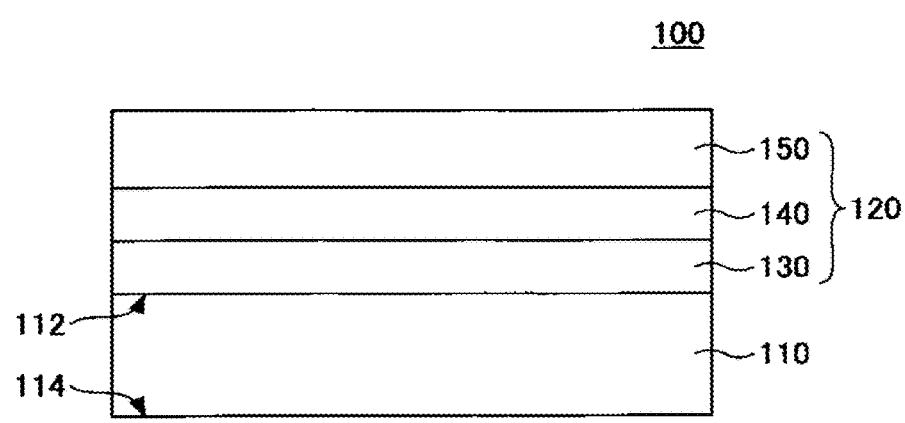
FIG. 4 is a cross-sectional view schematically showing an example of the construction of a mask blank in one embodiment of the present invention.

Now, with reference to FIG. 4, one embodiment of the present invention will be described. FIG. 4 schematically shows an example of a construction of a mask blank according to one embodiment of the present invention.

As shown in FIG. 4, the mask blank (hereinafter referred to as "first mask blank") 100 according to one embodiment of the present invention, comprises a substrate 110 having a first main surface 112 and a second main surface 114, and a laminate film 120 formed on the first main surface 112 of the substrate 110. The laminate film 120 has a reflective layer 130, an additional layer 140 and an absorber layer 150, from the side close to the substrate 110.

The reflective layer 130 has a function to reflect EUV light. The reflective layer 130 is constructed, for example, by a combination of a high refractive index film and a low refractive index film, or a multi-layer film having a repeating structure thereof.

The additional later 140 is formed in order to add at least one function required for the laminate film 120, such as a function to protect the reflective layer 130 and/or an etching stopping function to stop etching at the time of etching the absorber layer 150. However, the additional layer 140 is a layer to be optionally formed, and is not an essential layer.

The absorber layer 150 has a function to absorb EUV light.

Further, although not shown in the drawings, the first mask blank 100 may further have another layer such as a functional layer, on the absorber layer 150.

In the case of using a first mask blank 100 having such a construction, the first mask blank 100 is processed so that the absorber layer will have a prescribed pattern, and then utilized as a mask for a transfer process (hereinafter referred to as a "first mask"). In such a case, the first mask will be disposed at a position to face a substrate to be processed, such as a wafer, so that the absorber layer 150 side will face the surface to be processed. On the surface of the substrate to be processed, a light sensitive material such as a resist is previously formed. Then, EUV light is radiated towards the absorber layer 150 side of the first mask.

The first mask has the pattern of the absorber layer 150, and therefore, at a region where the absorber layer is present, EUV light will be shielded. That is, EUV light is reflected at a region where the absorber layer 150 is not present, and radiated to the substrate to be processed. It is thereby possible to transfer the desired pattern onto the light sensitive material of the substrate to be processed.

Here, the first mask blank 100 is characterized in that $S_{sk}<1.0$ is satisfied, where $S_{sk}$ is skewness in a region of 1 μm×1 μm on the absorber layer 150 side surface, and/or $S_{ku}<10$ is satisfied, where $S_{ku}$ is kurtosis in a region of 1 μm×1 μm on the absorber layer 150 side surface.

The skewness $S_{sk}$ preferably satisfies $S_{sk}<0.78$ and more preferably satisfies $S_{sk}<0.6$. Whereas, the kurtosis $S_{ku}$ preferably satisfies $S_{ku}<8$ and more preferably satisfies $S_{ku}<6$.

As mentioned above, in a case where a mask blank contains many pseudo defects, it becomes difficult to accurately know real defects contained in the mask blank.

However, the first mask blank 100 is characterized in that the skewness $S_{sk}$ satisfies $S_{sk}<1.0$, and/or the kurtosis $S_{ku}$ satisfies $S_{ku}<10$. And, as mentioned above, in a case where $S_{sk}<1.0$ and/or $S_{ku}<10$ is satisfied, the ranking of defects obtainable from the mapping result will be rank 1 or rank 0.

Thus, according to the first mask blank 100 having such characteristics, it is possible to significantly suppress pseudo defects. Further, it becomes thereby possible to accurately evaluate real defects contained, by the first mask blank 100.

(Constituting Members of First Mask Blank 100)

Here, the respective constituting members contained in the first mask blank 100 will be described in further detail.

(Substrate 110)

The substrate 110 is used to support the laminate film 120.

The material for the substrate 110 is not particularly limited, so long as useful as a substrate for an EUV mask blank. For example, the substrate 110 may be made of glass.

Particularly, in a case where the substrate 110 is made of glass, it is preferred that the substrate 110 is made of glass which is excellent in chemical resistance and heat resistance and has a small thermal expansion coefficient. As such glass, quartz glass containing $SiO_2$ as the main component may, for example, be used. The quartz glass may be one containing $TiO_2$. The $TiO_2$ content may, for example, be from 1 to 12 mass %.

(Reflective Layer 130)

The reflective layer 130 should preferably have a high EUV light reflectance. For example, when the surface of the reflective layer 130 is irradiated with EUV light at an incident angle of 6°, the maximum value of light reflectance in a wavelength region of from 13.3 nm to 13.7 nm is preferably at least 60%.

Such a reflective layer 130 may be made of a multi-layer film having a high refractive index layer and a low refractive index layer alternately laminated plural times, as mentioned above. In such a case, Si may be used for the high refractive index layer, and Mo may be used for the low refractive index layer. That is, a Mo/Si multi-layer film may be used.

However, the reflective layer 130 is not limited thereto, and, for example, a Ru/Si multi-layer film, a Mo/Be multi-layer film, a Mo compound/Si compound multi-layer film, a Si/Mo/Ru multi-layer film, a Si/Mo/Ru/Mo multi-layer film, and a Si/Ru/Mo/Ru multi-layer film, may also be used.

In a case where the reflective layer 130 is made of a multi-layer film, the thickness of each layer and the number of repeating units of layers may suitably be selected depending upon the film materials to be used and the EUV light reflectance required for the reflective layer 130. For example, in the case of a Mo/Si film, in order to obtain a reflective layer 130 with the maximum value of light reflectance in a wavelength region of from 13.3 nm to 13.7 nm being at least 60%, the multi-layer film may be formed by laminating a Mo layer having a thickness of 2.3±0.1 nm and a Si layer having a thickness of 4.5±0.1 nm so that the number of repeating units would be from 30 to 60.

In order to prevent surface oxidation of the reflective layer 130, it is preferred to use a hardly oxidizable layer (e.g. a Si layer) as the upper-most layer of the reflective layer 130. However, such an oxidation-preventing function may not necessarily be provided by the reflective layer 130, and an additional layer 140 which will be described later, may provide such a function.

The total thickness of the reflective layer 130 is, for example, within a range of from 200 nm to 400 nm.

(Additional Layer 140)

As the case requires, an additional layer 140 may be formed between the reflective layer 130 and the absorber layer 150.

The additional layer 140 may be a protective layer to protect the underlying reflective layer 130 or to prevent oxidation thereof. Or, the additional layer 140 may be an etching stopping layer at the time of etching the absorber layer 150 disposed above the additional layer 140.

For example, at the time of producing a first mask from the first mask blank 100, the absorber layer 150 may be subjected to patterning treatment by e.g. a dry etching process. The additional layer 140 may have a role of preventing the reflective layer 130 from suffering a damage at the time of such patterning treatment of the absorber layer 150.

In the case where the additional layer 140 functions as an etching stopping layer, the additional layer 140 may be made, for example, by Cr, Al, Ta or their nitrides, Ru or a Ru compound (RuB, RuSi, etc.), or $SiO_2$, $Si_3N_4$, $Al_2O_3$ or their mixture.

Among them, at least one member selected from the group consisting of Ru, a Ru compound, $SiO_2$ and a Cr compound, is particularly preferred. Further, among them, Ru or a Ru compound (RuB, RuSi, etc.) is especially preferred.

On the other hand, in the case where the additional layer 140 functions as a protective layer, it is possible to use Si, Ti, Ru, Rh, C, SiC or a mixture of these elements/compounds, or one having N, O or B, etc. added to these elements/compounds as the additional layer 140.

The thickness of the additional layer 140 is, for example, within a range of from 1 nm to 60 nm.

(Absorber Layer 150)

The absorber layer 150 preferably has a high absorbance of EUV light, i.e. a low EUV light reflectance. For example, when the surface of the absorber layer 150 is irradiated with EUV light, the average light reflectance at a wavelength region of from 13.3 nm to 13.7 nm is preferably at most 4.0%.

In order to exhibit such a characteristic, the absorber layer 150 is made of a material containing, for example, at least 40 at %, preferably at least 50 at %, more preferably at least 55 at %, of Ta.

The material containing Ta as the main component to be used for the absorber layer 150, preferably contains, in addition to Ta, at least one element selected from the group consisting of Hf, Si, Zr, Ge, B, Pd, Pt, H and N.

Specific examples of the material containing the above elements in addition to Ta, may, for example, be TaN, TaNH, TaHf, TaHfN, TaBSi, TaBSiN, TaB, TaBN, TaSi, TaSiN, TaGe, TaGeN, TaZr, TaZrN, TaPd, TaPdN, TaPt, TaPtN, etc. Here, it is preferred that the absorber layer 150 does not contain oxygen.

Specifically, the content of oxygen in the absorber layer 150 is preferably less than 25 at %.

The absorber layer has a thickness of, for example, within a range of from 30 nm to 90 nm.

(Other)

Further, the first mask blank 100 may have an electrically conductive layer on the second main surface 114 side of the substrate 110.

Such an electrically conductive layer is useful at the time of holding the first mask blank 100 by an electrostatic adsorption system. For example, in a case where the second surface 114 of the substrate 110 has an electrically conductive layer, it is possible to hold the substrate 110 by means of an electrostatic chuck, and in such a state, various handling such as film-forming treatment may be applied to e.g. the first surface 112 of the substrate 110.

The electrically conductive layer may be made of e.g. Si, TiN, Mo, Cr, CrN, CrO or TaSi. The electrically conductive layer may have a sheet resistance of at most 100Ω per square, and the thickness of the electrically conductive layer is, for example, from 10 nm to 1,000 nm.

(Another Mask Blank According to One Embodiment of the Present Invention)

Now, with reference to FIG. 5, another embodiment of the present invention will be described.

Figure 5:
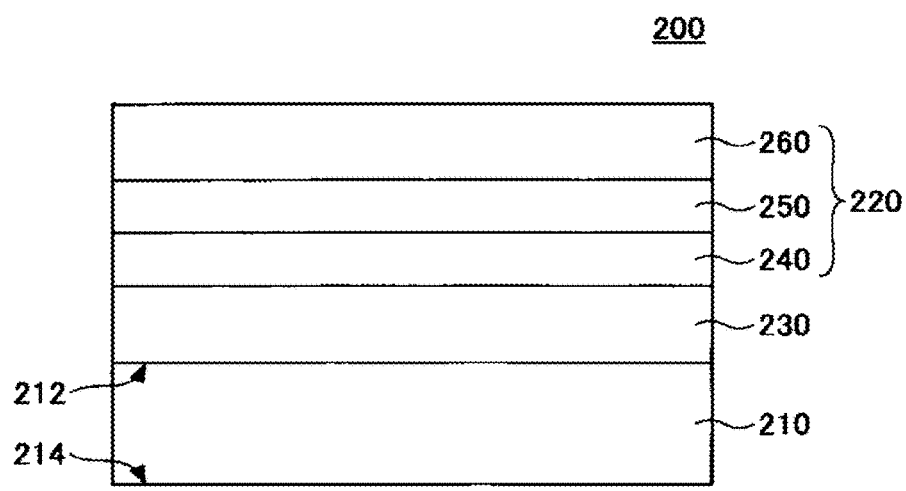
FIG. 5 is a cross-sectional view schematically showing an example of the construction of another mask blank in one embodiment of the present invention.

FIG. 5 schematically shows an example of a construction of another mask blank according to one embodiment of the present invention.

As shown in FIG. 5, another mask blank (hereinafter referred to as a "second mask blank") 200 according to one embodiment of the present invention has almost the same construction as the above-described first mask blank 100 shown in FIG. 4.

However, the second mask blank 200 is different from the first mask blank 100 in that it has a low reflective layer 260 on the absorber layer 250. That is, in the second mask blank 200, the laminate film 220 comprises a reflective layer 230, an additional layer 240, an absorber layer 250 and a low reflective layer 260. Here, as mentioned above, the additional layer 240 is a layer to be optionally formed and may be omitted.

Usually, at the time of producing a mask from a mask blank for EUV exposure, the absorber layer is patterned. At the time of ascertaining whether or not this absorber layer pattern is formed as designed, an inspection is carried out by inspection light having a wavelength within a range of from 190 nm to 260 nm. In the mask blank 200, the low reflective layer 260 is used in order to facilitate such an inspection.

That is, the pattern inspection of the absorber layer is carried out by utilizing a difference in reflectance of inspection light between a region where the absorber layer is present and a region where no absorber layer is present. At that time, in a case where a low reflective layer 260 is laminated on the absorber layer 250, the difference in reflectance of inspection light becomes large between the region where the absorber layer 250 is present and the region where no absorber layer 250 is present. Thus, by forming the low reflective layer 260, it becomes possible to carry out the inspection of the pattern of the absorber layer 250 with high precision.

Here, the second mask blank 200 is also characterized in that $S_{sk}<1.0$ is satisfied, where $S_{sk}$ is skewness in a region of 1 μm×1 μm on the low reflective layer 260 side surface, and/or $S_{ku}<10$ is satisfied, where $S_{ku}$ is kurtosis in a region of 1 μm×1 μm on the low reflective layer 260 side surface. The skewness $S_{sk}$ preferably satisfies $S_{sk}<0.78$ and more preferably satisfies $S_{sk}<0.6$. Whereas, the kurtosis $S_{ku}$ preferably satisfies $S_{ku}<8$ and more preferably satisfies $S_{ku}<6$.

Thus, also in the second mask blank 200, it is possible to obtain the same effect as in the first mask blank 100, i.e. it is possible to significantly suppress pseudo defects, whereby it is possible to more accurately evaluate real defects contained.

Further, although not shown in the drawings, the second mask blank 200 may further have another layer such as a functional layer on the low reflective layer 260.

(Low Reflective Layer 260)

Here, the construction of the low reflective layer 260 contained in the second mask blank 200 will be briefly described.

The low reflective layer 260 has a reflectance lower than the absorber layer 250 to inspection light to inspect a pattern of the absorber layer 250. As the inspection light, for example, light having a wavelength of about 257 nm or about 193 nm is used.

The low reflective layer 260 is made of e.g. a material containing Ta. The low reflective layer 260 may contain, in addition to Ta, at least one element among Hf, Ge, Si, B, N, H and O.

The low reflective layer 260 may be made of e.g. TaO, TaON, TaONH, TaBO, TaHfO, TaHfON, TaBSiO, TaBSiON, SiN, SiON, etc.

The total thickness of the absorber layer 250 and the low reflective layer 260 is e.g. within a range of from 10 nm to 90 nm. The total thickness is preferably within a range of from 30 nm to 85 nm, more preferably within a range of from 35 nm to 80 nm.

If the low reflective layer 260 is thicker than the absorber layer 250, the EUV light absorption properties at the absorber layer 250 is likely to deteriorate. Therefore, the thickness of the low reflective layer 260 is preferably thinner than the thickness of the absorber layer.

For example, the thickness of the low reflective layer 260 is from 1 nm to 20 nm, preferably from 1 nm to 15 nm, more preferably from 1 nm to 10 nm.

(Process for Producing Mask Blank According to One Embodiment of the Present Invention)

Next, with reference to FIG. 6, an example of the process for producing a mask blank according to one embodiment of the present invention will be described.

Figure 6:
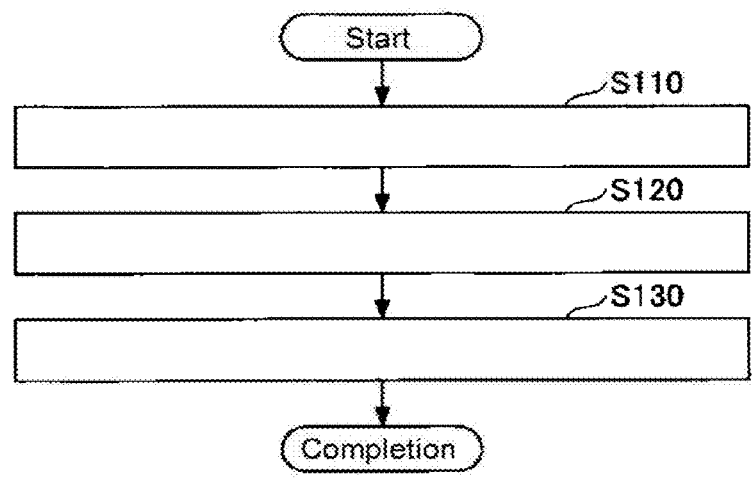
FIG. 6 is a flow chart schematically showing an example of a process for producing a mask blank in one embodiment of the present invention.

FIG. 6 shows a schematic flow of the process for producing a mask blank according to one embodiment of the present invention (hereinafter referred to as "the first production process").

As shown in FIG. 6, the first production process comprises:

(1) a step (S110) of forming a reflective layer on top of a substrate, (2) a step (S120) of forming an additional layer on top of the reflective layer, and (3) a step (S130) of forming an absorber layer on top of the additional layer.

However, the step S120 of (2) is not an essential step and may be omitted. In such a case, in the step S130 of (3), the absorber layer is formed on top of the reflective layer.

Now, each step will be described in detail. Here, the following description will be made with reference to the construction of the above-mentioned first mask blank 100 shown in FIG. 4. Accordingly, at the time of referring to the respective members, reference symbols as shown in FIG. 4 will be used.

(Step S110)

Firstly, a substrate 110 is prepared. As mentioned above, the material for the substrate 110 is not particularly limited, and the substrate 110 may be made of e.g. glass, silicon, metal, etc.

Then, a reflective layer 130 is formed on one main surface (the first main surface 112) of the substrate 110.

The method for forming the reflective layer 130 is not particularly limited. The reflective layer 130 may be formed by using e.g. a film-forming method such as a magnetron sputtering method or an ion beam sputtering method.

For example, in a case where a Mo/Si multi-layer film is to be formed by using an ion beam sputtering method, a step of forming a Mo layer by using a Mo target and a step of forming a Si layer by using a Si target, may be alternately repeatedly conducted.

(Step S120)

Then, as the case requires, an additional layer 140 is formed on the reflective layer 130.

As mentioned above, the additional layer 140 may be a protective layer to protect the underlying reflective layer 130 or to prevent oxidation thereof. Or, the additional layer 140 may be an etching stopping layer.

The method for forming the additional layer 140 is not particularly limited. The additional layer 140 may be formed by using e.g. a film-forming method such as a magnetron sputtering method or an ion beam sputtering method.

(Step S130)

Then, an absorber layer 150 is formed on the additional layer 140. Here, in a case where the additional layer 140 is not present, the absorber layer 150 is formed on the reflective layer 130.

The method for forming the absorber layer 150 is not particularly limited. The absorber layer 150 may be formed by using e.g. a film-forming method such as a magnetron sputtering method or an ion beam sputtering method.

Here, as mentioned above, the absorber layer 150 is characterized in that $S_{sk}<1.0$ is satisfied, where $S_{sk}$ is skewness in a region of 1 μm×1 μm on its surface, or $S_{ku}<10$ is satisfied, where $S_{ku}$ is kurtosis in a region of 1 μm×1 μm on its surface The absorber layer 150 having such characteristics may be formed e.g. by adjusting film-forming conditions in a film-forming method such as a magnetron sputtering method or an ion beam sputtering method.

For example, in the case of forming the absorber layer 150 by a magnetron sputtering method or an ion beam sputtering method, it is possible to form an absorber layer 150 satisfying $S_{sk}<1.0$ and/or $S_{ku}<10$, by properly controlling e.g. the gas pressure, gas composition and deposition rate during the film formation.

For example, the following film-forming conditions may be employed.

Gas composition: a mixed gas of Ar, Kr and $N_2$ (Ar:Kr:$N_2$=0 to 70 vol %:15 to 95 vol %:0 to 25 vol %), Gas pressure: at most 0.28 Pa, Deposition rate: at most 9.0 nm/min., etc.

By the foregoing steps, it is possible to produce the first mask blank 100 as shown in FIG. 4.

In the mask blank to be produced by the first production process, the surface of the absorber layer 150 is controlled as described above. Therefore, according to this first production process, it is possible to provide a mask blank having pseudo defects significantly suppressed. Further, it thereby becomes possible to more accurately evaluate real defects which may be contained in a mask blank to be produced, according to this first production process.

(Process for Producing Another Mask Blank According to One Embodiment of the Present Invention)

Next, with reference to FIG. 7, an example of the process for producing another mask blank according to one embodiment of the present invention will be described.

Figure 7:
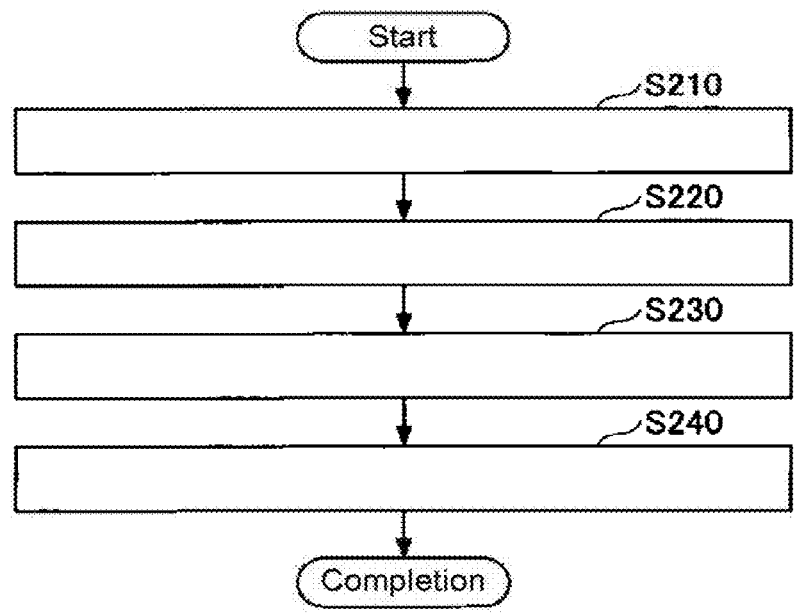
FIG. 7 is a flow chart schematically showing an example of another process for producing a mask blank in one embodiment of the present invention.

FIG. 7 shows a schematic flow of the process for producing another mask blank according to one embodiment of the present invention (hereinafter referred to as "the second production process").

As shown in FIG. 7, the second production process comprises:

(1) a step (S210) of forming a reflective layer on top of a substrate, (2) a step (S220) of forming an additional layer on top of the reflective layer, (3) a step (S230) of forming an absorber layer on top of the additional layer, and (4) a step (S240) of forming a low reflective layer on top of the absorber layer.

However, the step S220 of (2) is not an essential step and may be omitted. In such a case, in the step S230 of (3), the absorber layer is formed on top of the reflective layer.

Here, in the second production process, the processes of the step S210 to the step S230 are substantially the same as the processes of the step S110 to the step S130 in the above-described first production process. Therefore, here, the processes of the step S240 et seq. will be described. Further, in order to make the description clear, here, the following description will be made with reference to the construction of the above-mentioned second mask blank 200 as shown in FIG. 5. Therefore, at the time of referring to the respective members, reference symbols as shown in FIG. 5 will be used.

(Step S240)

In this step S240, a low reflective layer 260 will be formed on the absorber layer 250 formed in the step S230.

Here, as mentioned above, "low reflective" in a low reflective layer 260 means that the reflectance is significantly suppressed to inspection light for inspection of a pattern, having a wavelength of from 190 nm to 260 nm.

The method for forming the low reflective layer 260 is not particularly limited. The low reflective layer 260 may be formed, for example, by using a film-forming method such as a magnetron sputtering method or an ion beam sputtering method.

However, the low reflective layer 260 is characterized in that $S_{sk}<1.0$ is satisfied, where $S_{sk}$ is skewness in a region of 1 μm×1 μm on its surface, or $S_{ku}<10$ is satisfied, where $S_{ku}$ is kurtosis in a region of 1 μm×1 μm on its surface.

The low reflective layer 260 having such characteristics may be formed e.g. by adjusting film-forming conditions in a film-forming method such as a magnetron sputtering method or an ion beam sputtering method.

For example, in the case of forming the low reflective layer 260 by a magnetron sputtering method or an ion beam sputtering method, it is possible to form a low reflective layer 260 satisfying $S_{sk}<1.0$ and/or $S_{ku}<10$, by properly controlling e.g. the gas pressure, gas composition and deposition rate during the film formation.

For example, the following film-forming conditions may be employed.

Gas composition: a mixed gas of Ar, $O_2$ and $N_2$ (Ar:$O_2$:$N_2$=40 to 80 vol %:10 to 50 vol %:0 to 30 vol %), Gas pressure: at most 0.30 Pa, Deposition rate: at most 9.0 nm/min., etc.

Here, when the low reflective layer 260 has a thickness of at most 10 nm, the surface state of the low reflective layer 260 reflects the surface state of the underlying absorber layer 250.

Therefore, in the case of using such a "thin" low reflective layer 260, it is not necessary to precisely adjust the film-forming conditions of the low reflective layer 260 in order to satisfy the above mentioned skewness $S_{sk}$ and/or kurtosis $S_{ku}$.

In other words, in the case where the low reflective layer 260 is "thin", if an absorber layer 250 having the above mentioned skewness $S_{sk}$ and/or kurtosis $S_{ku}$ is preliminarily formed, the state of such skewness $S_{sk}$ and/or kurtosis $S_{ku}$ will be maintained on the outer-most surface even after forming the low reflective layer 260.

By the foregoing steps, it is possible to produce the second mask blank 200 as shown in FIG. 5.

In the mask blank to be produced by the second production process, the surface of the low reflective layer 260 is controlled as described above. Therefore, according to this second production process, it is possible to provide a mask blank having pseudo defects significantly suppressed. Further, it thereby becomes possible to more accurately evaluate real defects which may be contained in a mask blank to be produced, according to this second production process.

EXAMPLES

Now, Examples of the present invention will be described.

Example 1

A mask blank was produced by the following process.

Firstly, as the substrate, a glass substrate ($SiO_2$—$TiO_2$ type) of 152.4 mm in length×152.4 mm in width×6.3 mm in thickness was prepared.

This glass substrate had a thermal expansion coefficient of $0.2×10^{-7}$/° C., a Young's modulus of 67 GPa, a Poisson's ratio of 0.17 and a specific rigidity of $3.07×10^7$ m$^2$/s$^2$. The glass substrate was polished so that the surface roughness (root-mean-square height Sq) of the main surface became at most 0.15 nm and the flatness became at most 100 nm, and then used.

Then, an electrically conductive layer was formed on one surface (the second main surface) of the glass substrate. The electrically conductive layer was a CrN layer and was formed by a magnetron sputtering method so that the thickness would be about 100 nm. The sheet resistance of the electrically conductive layer was at most 100Ω per square.

Then, by using an electrostatic chuck, the glass substrate was fixed in a film-forming chamber by an electrostatic adsorption system via the electrically conductive layer. And, in that state, a reflective layer was formed on the first main surface of the glass substrate.

By using an ion beam sputtering method for the film formation, a Mo/Si multi-layer film was formed by forming a Mo layer with a thickness of 2.3 nm and a Si layer with a thickness of 4.5 nm alternately 50 times each.

In the film formation of the Mo layer, a Mo target was used, and an ion beam sputtering was conducted in an Ar gas atmosphere (gas pressure: 0.02 Pa). The applied voltage was 700 V, and the deposition rate was 3.84 nm/min.

On the other hand, in the film formation of the Si layer, a boron-doped Si target was used, and an ion beam sputtering was conducted in an Ar gas atmosphere (gas pressure: 0.02 Pa). The applied voltage was 700 V, and the deposition rate was 4.62 nm/min.

The total thickness (target value) of the multi-layer film was (2.3 nm+4.5 nm)×50 times=340 nm. Here, the upper-most layer of the multi-layer film was a Si layer.

Then, an additional layer was formed on the reflective layer by an ion beam sputtering method.

The additional layer was a Ru layer, and by using a Ru target, an ion beam sputtering was conducted in an Ar gas atmosphere (gas pressure: 0.02 Pa). The applied voltage was 700 V, and the deposition rate was 3.12 nm/min. The thickness of the additional layer was 2.5 nm.

Then, an absorber layer was formed on the additional layer by a magnetron sputtering method.

The absorber layer was a TaN layer, and by using a Ta target, a magnetron sputtering was conducted in an atmosphere of a mixed gas of Kr and $N_2$ (Kr=89 vol %, $N_2$=11 vol %) (gas pressure: 0.18 Pa). The deposition rate was 7.7 nm/min., and the film thickness was 75 nm.

Then, a low reflective layer was formed on the absorber layer by a magnetron sputtering method.

The low reflective layer was a TaON layer, and by using a Ta target, a magnetron sputtering was conducted in an atmosphere of a mixed gas of Ar, $O_2$ and $N_2$ (Ar=60 vol %, $O_2$=30 vol %, $N_2$=10 vol %) (gas pressure: 0.29 Pa). The deposition rate was 1.32 nm/min., and the thickness of the low reflective layer was 5 nm.

Thus, a mask blank (referred to as sample 1) according to Example 1 was produced.

Example 2

In the same manner as in Example 1, a mask blank was produced.

However, in this Example 2, the conditions at the time of film-forming a TaN absorber layer by a magnetron sputtering method, were changed from the case in Example 1. More specifically, the mixing ratio (volume ratio) of Kr and $N_2$ in the mixed gas was made to be 91:9. Other conditions were the same as in Example 1.

The produced sample will be referred to as "sample 2".

Example 3

In the same manner as in Example 1, a mask blank was produced.

However, in this Example 3, the conditions at the time of film-forming a TaN absorber layer by a magnetron sputtering method, were changed from the case in Example 1. More specifically, the mixing ratio (volume ratio) of Kr and $N_2$ in the mixed gas was made to be 93:7. Other conditions were the same as in Example 1.

The produced sample will be referred to as "sample 3".

Example 4

In the same manner as in Example 1, a mask blank was produced.

However, in this Example 4, the conditions at the time of film-forming a TaN absorber layer by a magnetron sputtering method, were changed from the case in Example 1. More specifically, as the mixed gas, a mixed gas of Ar, Kr and $N_2$ was used. The mixing ratio of Ar, Kr and $N_2$ was made to be 67:17:16. Further, the gas pressure was made to be 0.26 Pa. Other conditions were the same as in Example 1.

The produced sample will be referred to as "sample 4".

Example 5

In the same manner as in Example 1, a mask blank was produced.

However, in this Example 5, the conditions at the time of film-forming a TaN absorber layer by a magnetron sputtering method, were changed from the case in Example 1. More specifically, the mixing ratio (volume ratio) of Kr and $N_2$ in the mixed gas was made to be 95:5. Other conditions were the same as in Example 1.

The produced sample will be referred to as "sample 5".

Comparative Example 1

In the same manner as in Example 1, a mask blank was produced.

However, in this Comparative Example 1, the conditions at the time of film-forming a TaN absorber layer by a magnetron sputtering method, were changed from the case in Example 1. More specifically, as the mixed gas, a mixed gas of Ar, Kr and $N_2$ was used. The mixing ratio of Ar, Kr and $N_2$ was made to be 67:17:16. Further, the gas pressure was made to be 0.30 Pa. Other conditions were the same as in Example 1.

The produced sample will be referred to as "sample 6".

Comparative Example 2

In the same manner as in Example 1, a mask blank was produced.

However, in this Comparative Example 2, the conditions at the time of film-forming a TaN absorber layer by a magnetron sputtering method, were changed from the case in Example 1. More specifically, as the mixed gas, a mixed gas of Ar, Kr and $N_2$ was used. The mixing ratio of Ar, Kr and $N_2$ was made to be 67:17:16. Further, the gas pressure was made to be 0.32 Pa. Other conditions were the same as in Example 1.

The produced sample will be referred to as "sample 7".

Comparative Example 3

In the same manner as in Example 1, a mask blank was produced.

However, in this Comparative Example 3, the conditions at the time of film-forming a TaN absorber layer by a magnetron sputtering method, were changed from the case in Example 1. More specifically, as the mixed gas, a mixed gas of Ar, Kr and $N_2$ was used. The mixing ratio of Ar, Kr and $N_2$ was made to be 67:17:16. Further, the gas pressure was made to be 0.36 Pa. Other conditions were the same as in Example 1.

The produced sample will be referred to as "sample 8".

Comparative Example 4

In the same manner as in Example 1, a mask blank was produced.

However, in this Comparative Example 4, the conditions at the time of film-forming a TaN absorber layer by a magnetron sputtering method, were changed from the case in Example 1. More specifically, as the mixed gas, a mixed gas of Ar, Kr and $N_2$ was used. The mixing ratio of Ar, Kr and $N_2$ was made to be 67:17:16. Further, the gas pressure was made to be 0.38 Pa. Other conditions were the same as in Example 1.

The produced sample will be referred to as "sample 9".

As described in the foregoing, 9 types of mask blanks were produced.

(Evaluations)

By using each sample produced as described above, the following evaluations were carried out.

(Mapping Evaluation of Defects)

By using a flow inspection device with visible light laser beam (M1350; manufactured by Lasertec Corporation), mapping evaluation was carried out with respect to the surface on the low reflective layer side of each sample. The evaluation region was an area of 132 mm×132 mm.

(Evaluation of Skewness $S_{sk}$ and Kurtosis $S_{ku}$)

By using an atomic force microscope (AFM; manufactured by SII), the surface roughness on the low reflective layer side of each sample was measured. The obtained surface roughness (height displacement component) was calculated based on the above-mentioned formulae (3) and (4), whereby skewness $S_{sk}$ and kurtosis $S_{ku}$ were evaluated. The evaluation region was an area of 1 µm×1 µm. For the evaluation of $S_{sk}$ and $S_{ku}$, an image analyzing software (SPIP Ver. 6.3.4; manufactured by Image Methodology) was used, but the evaluation method is not limited thereto, so long as it is in accordance with the formulae (3) and (4).

(Results)

Figure 8:
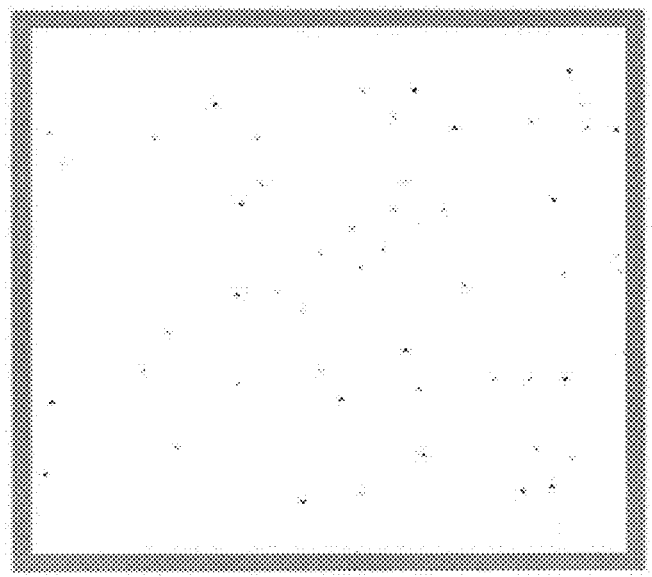
FIG. 8 is a view showing a mapping result obtained by a sample (sample 1) in Example 1 of the present invention.
Figure 9:
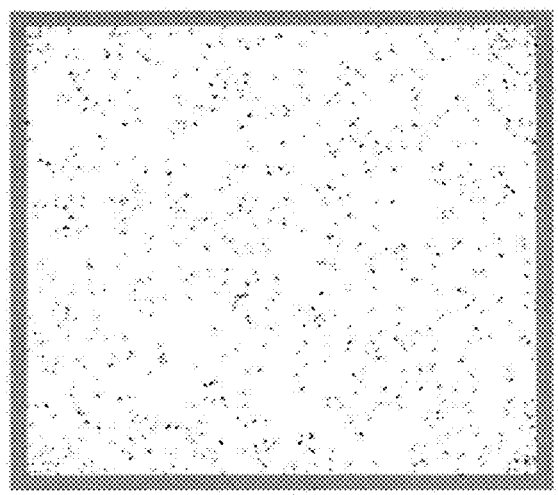
FIG. 9 is a view showing a mapping result obtained by a sample (sample 4) in Example 4 of the present invention.

FIG. 8 shows the mapping result obtained with respect to sample 1. Further, FIG. 9 shows the mapping result obtained with respect to sample 4. Still further, the above-mentioned FIGS. 1 and 2, respectively, show the mapping results obtained with respect to sample 7 and sample 9.

From the comparison of the mapping results in FIGS. 8, 1 and 2, it is seen that in the map obtained with respect to sample 1, the density of plotted points showing defects is substantially lower as compared with sample 7 and sample 9.

Likewise, from the comparison of the mapping results in FIGS. 9, 1 and 2, it is seen that in the map obtained with respect to sample 4, the density of plotted points showing defects is substantially lower as compared with sample 7 and sample 9. Particularly, from the comparison of FIGS. 8 and 9, it is seen that in the map obtained with respect to sample 1, the density of plotted points is significantly lower even as compared with in the map with respect to sample 4.

Thus, in the map shown in FIG. 9, the density of plotted points is in a state lower than rank 2 of the map shown in FIG. 1, and such a mapping state can be ranked to be rank 1. Further, in the map shown in FIG. 8, the density of plotted points is in a state lower than rank 1 of the map shown in FIG. 9, and such a mapping state can be ranked to be rank 0.

Further, although not shown in the drawings, in the cases of sample 2 and sample 3, the same results as the mapping result shown in FIG. 8 were obtained, i.e. it has been found it possible to obtain the mapping state of rank 0. Further, in the case of sample 5, the same result as the mapping result shown in FIG. 9 was obtained, i.e. it has been found it possible to obtain the mapping state of rank 1.

Whereas, sample 6 was found to be classified in rank 2 from the mapping result, and sample 8 was found to be classified in rank 3 from the mapping result.

Figure 10:
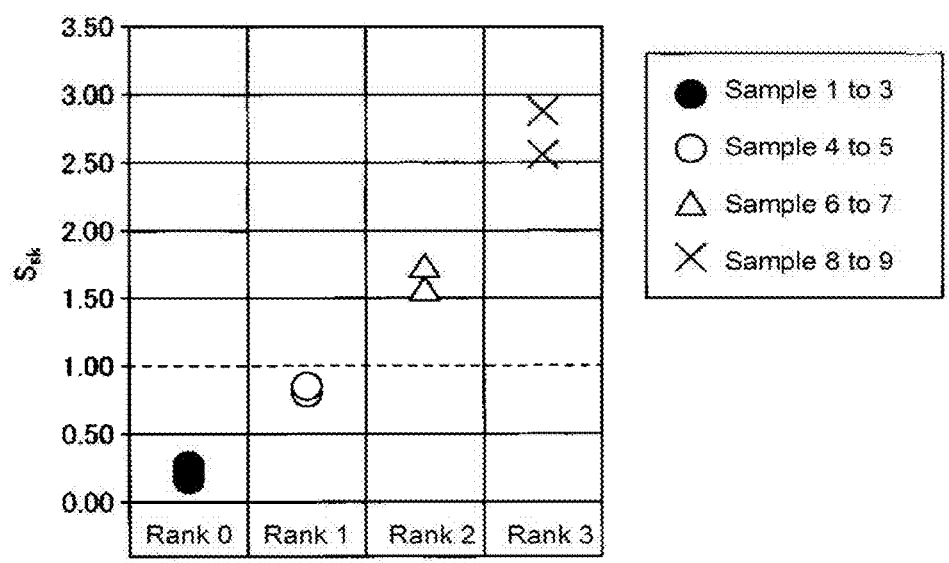
FIG. 10 is a graph showing a relation between skewness $S_{sk}$ obtained with respect to each sample and the ranking obtained from the mapping result.
Figure 11:
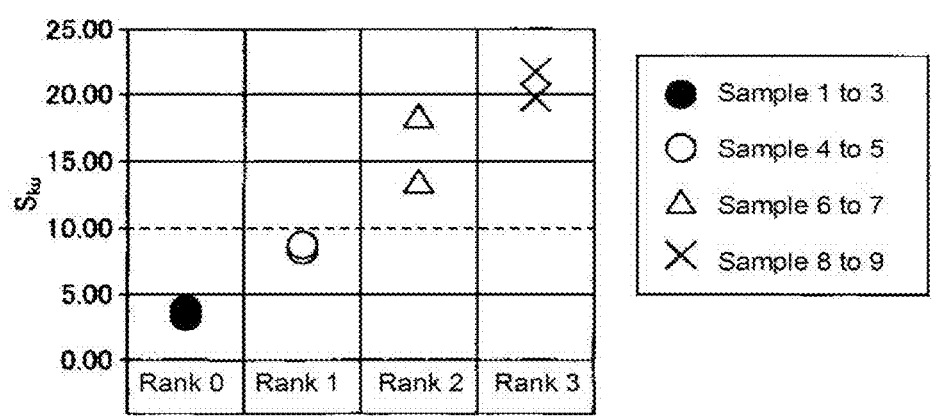
FIG. 11 is a graph showing a relation between kurtosis $S_{ku}$ obtained with respect to each sample and the ranking obtained from the mapping result.

FIG. 10 shows the relation between skewness $S_{sk}$ obtained with respect to each sample and the rank obtained from its mapping result. Further, FIG. 11 shows the relation between kurtosis $S_{ku}$ obtained with respect to each sample and the rank obtained from its mapping result.

Further, in the following Table 1, the results of skewness $S_{sk}$ and kurtosis $S_{ku}$ obtained with respect to each sample are shown as summarized.

TABLE 1

| Sample | Skewness $S_{sk}$ | Kurtosis $S_{ku}$ | Sq(nm) |
|---|---|---|---|
| 1 | 0.17 | 3.34 | 0.270 |
| 2 | 0.20 | 3.63 | 0.279 |
| 3 | 0.27 | 3.90 | 0.281 |
| 4 | 0.80 | 8.36 | 0.305 |
| 5 | 0.85 | 8.74 | 0.308 |
| 6 | 1.57 | 13.52 | 0.303 |
| 7 | 1.74 | 18.39 | 0.250 |
| 8 | 2.56 | 19.76 | 0.289 |
| 9 | 2.88 | 21.70 | 0.318 |

Further, in Table 1, for the purpose of reference, the value of root-mean-square height $S_q$ of the surface on the low reflective layer side obtained in each sample was also shown (evaluation region: 1 μm×1 μm).

In FIG. 10, the abscissa represents ranks obtained from the mapping results, and the ordinate represents the skewness $S_{sk}$. Likewise, in FIG. 11, the abscissa represents ranks obtained from the mapping results, and the ordinate represents the kurtosis $S_{ku}$.

From Table 10, it is seen that there is good correlation between the rank obtained from the mapping result and the skewness $S_{sk}$. Further, it is seen that in a case where the skewness $S_{sk}$ satisfies $S_{sk}<1.0$, the mapping result of such a sample at least corresponds to at most rank 1.

From such results, it has been found that it is possible to significantly suppress the influence of pseudo defects influential to the mapping result of defects, by obtaining a mask blank satisfying $S_{sk}<1.0$. In such a case, it becomes possible to more easily and accurately know real defects from the mapping result.

Likewise, from Table 11, it is seen that there is good correlation between the rank obtained from the mapping result and the kurtosis $S_{ku}$. Further, it is seen that in a case where the kurtosis $S_{ku}$ satisfies $S_{ku}<10$, the mapping result of such a sample at least corresponds to at most rank 1.

From such results, it has been found that it is possible to significantly suppress the influence of pseudo defects influential to the mapping result of defects, by obtaining a mask blank satisfying $S_{ku}<10$. In such a case, it becomes possible to more easily and accurately know real defects from the mapping result.

When attention is paid to sample 7, it is seen that the value of $S_q$ is the smallest. In such a case, if PSD is evaluated based on the formula (6), PSD at a special frequency of from 1 to 10 μm$^{-1}$ becomes to be 46.8 nm$^4$, and thus, both $S_q$ and PSD show sufficiently small values. However, it is seen that such a mapping result corresponds to rank 2. From this result, it has been found that it is impossible to significantly suppress the influence of pseudo defects influential to the mapping result, by reducing only the values of $S_q$ and PSD. Thus, it is seen that in order to significantly suppress the influence of pseudo defects influential to the mapping result, it is effective to maintain the values of $S_{sk}$ and $S_{ku}$ to be at most the prescribed levels.

REFERENCE SYMBOLS

100: first mask blank, 110: substrate, 112: first main surface, 114: second main surface, 120: laminate film, 130: reflective layer, 140: additional layer, 150: absorber layer, 200: second mask blank, 210: substrate, 212: first main surface, 214: second main surface, 220: laminate film, 230: reflective layer, 240: additional layer, 250: absorber layer, 260: low reflective layer The entire disclosure of Japanese Patent Application No. 2016-033603 filed on Feb. 24, 2016 including specification, claims, drawings and summary is incorporated herein by reference in its entirety.

What is claimed is:

1. A reflective mask blank comprising:
    a substrate,
    a reflective layer for reflecting extreme Ultra-Violet (EUV) light, formed on the substrate, and
    an absorber layer for absorbing EUV light, formed on the reflective layer,
    wherein $S_{sk}<1.0$ is satisfied, where $S_{sk}$ is skewness in a region of 1 μm×1 μm on the absorber layer side surface, or $S_{ku}<10$ is satisfied, where $S_{ku}$ is kurtosis in a region of 1μm×1 μm on the absorber layer side surface,
    wherein the skewness $S_{sk}$ is represented by the following formula (3):

$$S_{sk} = \frac{1}{S_q^3}\left[\frac{1}{A}\int\int_A z^3(x,y)\,dx\,dy\right], \qquad \text{Formula (3)}$$

wherein the skewness $S_{sk}$ represents a symmetry of concaves and convexes to a standard height $S_q$, wherein $S_q$ is represented by the following formula (2):

$$S_q = \sqrt{\frac{1}{A}\iint_A z^2(x,y)\,dxdy},\qquad \text{Formula (2)}$$

wherein A represents a standard area of a surface to be evaluated, and wherein the kurtosis $S_{ku}$ is represented by the following formula (4):

$$S_{ku} = \frac{1}{S_q^4}\left[\frac{1}{A}\iint_A z^4(x,y)\,dxdy\right],\qquad \text{Formula (4)}$$

wherein the kurtosis $S_{ku}$ represents a peaked state of convexes or concaves to the standard height $S_q$.

2. The reflective mask blank according to claim 1, wherein on the absorber layer, a low reflective layer against inspection light for inspecting a pattern, having a wavelength of from 190 nm to 260 nm, is formed.

3. The reflective mask blank according to claim 2, wherein the low reflective layer comprises tantalum, nitrogen and oxygen.

4. The reflective mask blank according to claim 1, which has an additional layer between the reflective layer and the absorber layer.

5. The reflective mask blank according to claim 1, wherein the absorber layer comprises tantalum and nitrogen.

6. The reflective mask blank according to claim 1, wherein the substrate is a glass substrate.

7. A process for producing a reflective mask blank, comprising:
(1) forming a reflective layer for reflecting extreme Ultra-Violet (EUV) light, on a substrate, and
(2) forming an absorber layer for absorbing EUV light, on the reflective layer, wherein $S_{sk}<1.0$ is satisfied, where $S_{sk}$ is skewness in a region of 1 µm×1 µm on the surface of the absorber layer obtained in (2), or $S_{ku}<10$ is satisfied, where $S_{ku}$ is kurtosis in a region of 1 µm×1 µm on the surface of the absorber layer obtained in (2),
wherein the skewness $S_{sk}$ is represented by the following formula (3):

$$S_{sk} = \frac{1}{S_q^3}\left[\frac{1}{A}\iint_A z^3(x,y)\,dxdy\right],\qquad \text{Formula (3)}$$

wherein the skewness $S_{sk}$ represents a symmetry of concaves and convexes to a standard height $S_q$, wherein $S_q$ is represented by the following formula (2):

$$S_q = \sqrt{\frac{1}{A}\iint_A z^2(x,y)\,dxdy},\qquad \text{Formula (2)}$$

wherein A represents a standard area of a surface to be evaluated, and wherein the kurtosis $S_{ku}$ is represented by the following formula (4):

$$S_{ku} = \frac{1}{S_q^4}\left[\frac{1}{A}\iint_A z^4(x,y)\,dxdy\right],\qquad \text{Formula (4)}$$

wherein the kurtosis $S_{ku}$ represents a peaked state of convexes or concaves to the standard height $S_q$.

8. A process for producing a reflective mask blank, the process comprising:
(1) forming a reflective layer for reflecting extreme Ultra-Violet (EUV) light, on a substrate,
(2) forming an absorber layer for absorbing EUV light, on the reflective layer, and
(3) forming a low reflective layer against inspection light for inspecting a pattern, having a wavelength of from 190 nm to 260 nm, on the absorber layer, wherein $S_{sk}<1.0$ is satisfied, where $S_{sk}$ is skewness in a region of 1 µm×1 µm on the surface of the low reflective layer obtained in (3), or $S_{ku}<10$ is satisfied, where $S_{ku}$ is kurtosis in a region of 1 µm×1 µm on the surface of the low reflective layer obtained in (3),
wherein the skewness $S_{sk}$ is represented by the following formula (3):

$$S_{sk} = \frac{1}{S_q^3}\left[\frac{1}{A}\iint_A z^3(x,y)\,dxdy\right],\qquad \text{Formula (3)}$$

wherein the skewness $S_{sk}$ represents a symmetry of concaves and convexes to a standard height $S_q$, wherein $S_q$ is represented by the following formula (2):

$$S_q = \sqrt{\frac{1}{A}\iint_A z^2(x,y)\,dxdy},\qquad \text{Formula (2)}$$

wherein A represents a standard area of a surface to be evaluated, and wherein the kurtosis $S_{ku}$ is represented by the following formula (4):

$$S_{ku} = \frac{1}{S_q^4}\left[\frac{1}{A}\iint_A z^4(x,y)\,dxdy\right],\qquad \text{Formula (4)}$$

wherein the kurtosis $S_{ku}$ represents a peaked state of convexes or concaves to the standard height $S_q$.

9. The process for producing a reflective mask blank according to, claim 8, wherein the low reflective layer comprises tantalum, nitrogen and oxygen.

10. The process for producing a reflective mask blank according to claim 7, further comprising forming an additional layer on the reflective layer before the forming of the absorber layer.

11. The process for producing a reflective mask blank according to claim 8, further comprising forming an additional layer on the reflective layer before the forming of the absorber layer.

12. The process for producing a reflective mask blank according to claim 7, wherein the absorber layer comprises tantalum and nitrogen.

13. The process for producing a reflective mask blank according to claim 8, wherein the absorber layer comprises tantalum and nitrogen.

14. The process for producing a reflective mask blank according to claim 7, wherein the substrate is a glass substrate.

15. The process for producing a reflective mask blank according to claim 8 , wherein the substrate is a glass substrate.

16. The process for producing a reflective mask blank according to claim 7, wherein the absorber layer is formed under a gas pressure of at most 0.28 Pa.

17. The process for producing a reflective mask blank according to claim 8, wherein the absorber layer is formed under a gas pressure of at most 0.28 Pa.

* * * * *